(12) United States Patent
Tsai et al.

(10) Patent No.: US 10,068,907 B1
(45) Date of Patent: Sep. 4, 2018

(54) DYNAMIC RANDOM ACCESS MEMORY

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Tsung-Ying Tsai, Kaohsiung (TW); Chien-Ting Ho, Taichung (TW); Ming-Te Wei, Changhua County (TW); Li-Wei Feng, Kaohsiung (TW); Ying-Chiao Wang, Changhua County (TW)

(73) Assignees: UNITED MICROELECTRONICS CORP., Hsin-Chu (TW); Fujian Jinhua Integrated Circuit Co., Ltd., Quanzhou, Fujian Province (CN)

(*) Notice: Subject to any disclaimer, the term of this patent is extended or adjusted under 35 U.S.C. 154(b) by 0 days.

(21) Appl. No.: 15/593,338

(22) Filed: May 12, 2017

(30) Foreign Application Priority Data

Apr. 7, 2017 (CN) .......................... 2017 1 0224324

(51) Int. Cl.
| | |
|---|---|
| H01L 23/528 | (2006.01) |
| H01L 27/108 | (2006.01) |
| H01L 29/06 | (2006.01) |

(52) U.S. Cl.
CPC ...... *H01L 27/10823* (2013.01); *H01L 23/528* (2013.01); *H01L 27/10814* (2013.01); *H01L 27/10855* (2013.01); *H01L 27/10885* (2013.01); *H01L 27/10888* (2013.01); *H01L 29/0649* (2013.01)

(58) Field of Classification Search
CPC ...... H01L 27/108; H01L 23/525; H01L 29/06
See application file for complete search history.

(56) References Cited

U.S. PATENT DOCUMENTS

| 7,476,920 B2 | 1/2009 | Schloesser | |
|---|---|---|---|
| 2015/0294923 A1* | 10/2015 | Shin | ...................... H01L 23/481 257/532 |

\* cited by examiner

*Primary Examiner* — Asok K Sarkar
*Assistant Examiner* — Dmitriy Yemelyanov
(74) *Attorney, Agent, or Firm* — Winston Hsu

(57) ABSTRACT

A dynamic random access memory (DRAM) includes a substrate, two buried word lines and a bit line contact. The substrate includes a first active area, wherein the first active area extends along a first direction. The buried word lines are disposed in the substrate and across the first active area, wherein the buried word lines extend along a second direction. The bit line contact is disposed on the substrate and overlaps the first active area between the two buried word lines, wherein the bit line contact is enclosed by a first side, a second side, a third side and a fourth side, and the first side is parallel to the third side along a third direction while the second side is parallel to the fourth side along a fourth direction, wherein the third direction is parallel to the first direction and the fourth direction is parallel to the second direction.

15 Claims, 6 Drawing Sheets

DYNAMIC RANDOM ACCESS MEMORY

BACKGROUND OF THE INVENTION

1. Field of the Invention

The present invention relates generally to a memory device, and more specifically to a dynamic random access memory device.

2. Description of the Prior Art

For years the trend in the memory industry as well as the semiconductor industry has been to scale down the size of memory cells in order to increase the integration level and thus the memory capacity of DRAM chips. In a DRAM cell with a buried gate, the current leakage caused by a capacitor is often reduced or avoided thanks to a relatively long channel length beneath the buried gate. Therefore, more and more DRAM cells are equipped with buried gates rather than with a conventional planar gate structure due to their superior performance.

In general, the DRAM cells with a buried gate include a transistor device and a charge storage device, which is able to accept signals from a bit line and a word line during the operation. However, due to limitations in fabrication technologies, many defects are formed in the DRAM cell with the buried gate. Therefore, there is still a need to provide an improved memory cell with a buried gate to gain enhanced performance and reliability of the corresponding memory device.

SUMMARY OF THE INVENTION

The present invention provides a dynamic random access memory (DRAM), which includes bit line contacts having sidewalls parallel to active areas right below the bit line contacts for completely overlapping or extending from the active areas, thereby avoiding turning on current between storage node contacts and the bit line contacts and thus avoiding short circuit occurring.

The present invention provides a dynamic random access memory (DRAM) including a substrate, two buried word lines and a bit line contact. The substrate includes a first active area, wherein the first active area extends along a first direction. The two buried word lines are disposed in the substrate and across the first active area, wherein the buried word lines extend along a second direction. The bit line contact is disposed on the substrate and overlaps the first active area between the two buried word lines, wherein the bit line contact is enclosed by a first side, a second side, a third side and a fourth side, and the first side is parallel to the third side along a third direction while the second side is parallel to the fourth side along a fourth direction, wherein the third direction is parallel to the first direction and the fourth direction is parallel to the second direction.

According to the above, the present invention provides a dynamic random access memory (DRAM) including a first active area extending along a first direction, two buried word lines disposed across the first active area, and a bit line contact overlapping the first active area between the two buried word lines. It is emphasized that the bit line contact has a first side and a third side, and both sides are parallel to the first direction. Thereby, the bit line contact with a minimum layout area can completely overlap or extend from the first active area. Hence, this avoids turning on current between storage node contacts and the bit line contact and thus avoids short circuit occurring.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
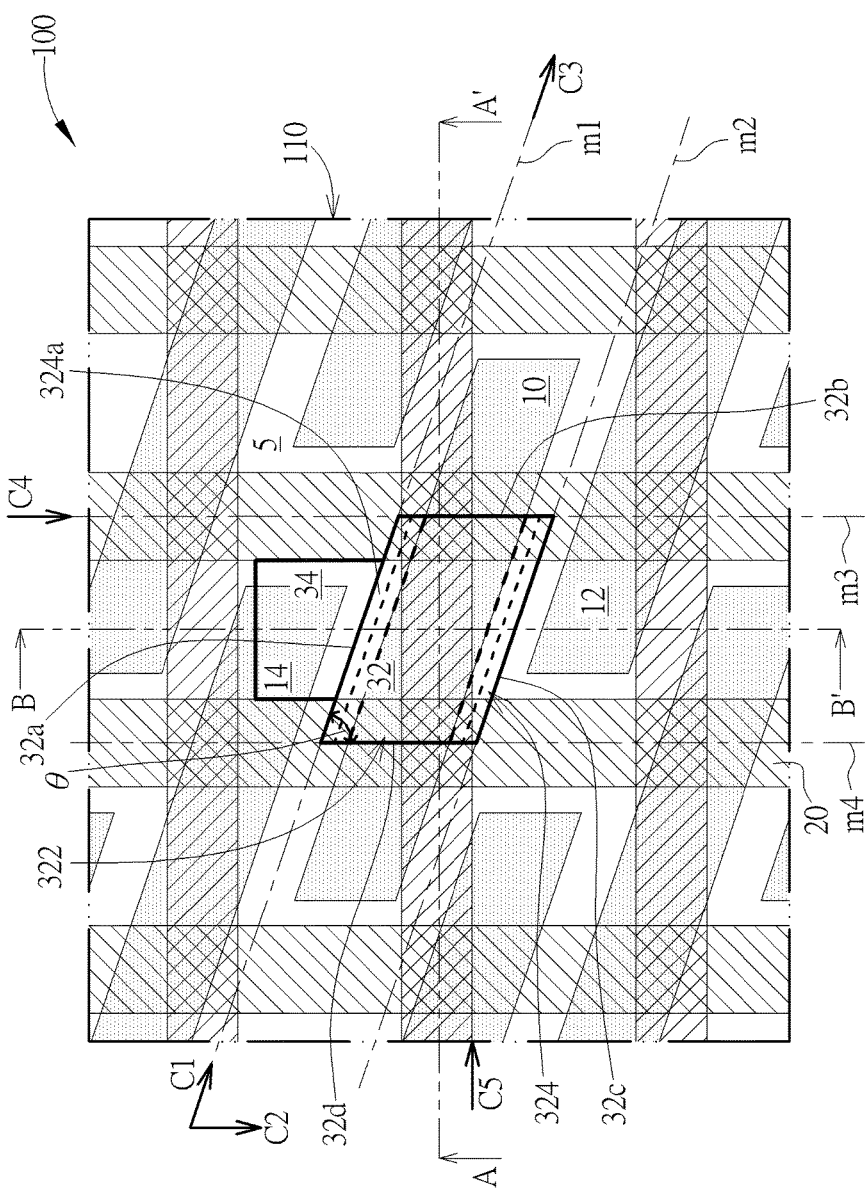
FIG. 1 schematically depicts a top view of a dynamic random access memory device according to an embodiment of the present invention.

FIG. 1 schematically depicts a top view of a dynamic random access memory device according to an embodiment of the present invention. A substrate 110 may be a semiconductor substrate such as a silicon substrate, a silicon containing (such as silicon carbide) substrate, a III-V group-on-silicon (such as GaN-on-silicon) substrate, a graphene-on-silicon substrate, a silicon-on-insulator (SOI) substrate or a substrate containing epitaxial layers. The substrate 110 may include a first active area 10 and other active areas, wherein other active areas may include an active area 12 and an active area 14 beside the first active area 10. In this embodiment, the first active area 10 extends along a first direction C1 while the other active areas are parallel to the first active area 10 and extend along the first direction C1. The first active area 10 and each of the other active areas are isolated from each other by an isolation structure 5. The isolation structure 5 may be a shallow trench isolation (STI) structure, but it is not limited thereto.

A plurality of buried word lines (BWL) 20 are disposed in the substrate 110 and across the first active area 10. The buried word lines 20 extend along a second direction C2. In a preferred embodiment, the angle between the first direction C1 and the second direction C2 is 70°-75°; in a still preferred embodiment, the angle between the first direction C1 and the second direction C2 is 71.2°, but it is not limited thereto.

A bit line contact (BLC) 32 is disposed on the substrate 110. The bit line contact 32 covers and electrically connects the first active area 10 between the buried word lines 20. Preferably, the bit line contact 32 covers and electrically connects the whole first active area 10 between the buried word lines 20 to avoid turning on current between storage node contacts and the bit line contact 32 through the exposed part of the first active area 10, and thus avoid short circuit occurring. Still preferably, the bit line contact 32 not only covers the whole first active area 10 between the buried word lines 20, but also extends from the whole first active area 10 between the buried word lines 20 to ensure the first active area 10 is not being exposed, which would lead to turning on current between storage node contacts and the bit line contact 32 and short circuit occurring.

The bit line contact 32 may be enclosed by a first side 32a, a second side 32b, a third side 32c and a fourth side 32d. Preferably, the first side 32a is parallel to the third side 32c and extends along a third direction C3, while the second side 32b is parallel to the fourth side 32d and extends along a fourth direction C4, thereby constituting a parallelogram area, but it is not limited thereto. In this embodiment, the third direction C3 is parallel to the first direction C1, enabling the shape of the bit line contact 32 to be similar to the shape of the first active area 10. Thereby, the bit line contact 32 can overlap the first active area 10 completely with a minimum layout area, meanwhile avoiding turning on current between storage node contacts and the bit line contact 32, which causes short circuiting to occur.

Still preferably, the bit line contact 32 not only covers the whole first active area 10 but also extends from the whole first active area 10, therefore the first side 32a and the third side 32c of the bit line contact 32 do not overlap the first active area 10, and the first side 32a and the third side 32c directly on the isolation structure 5. Thereby, the bit line contact 32 may include a body part 322 overlapping the first active area 10 and two flap parts 324 that do not overlap the first active area 10, wherein the two flap parts 324 may include spacers 324a being outer parts for self-aligning storage node contacts in later processes. In other words, the first side 32a is located between the first active area 10 and the active area 14, while the third side 32c is located between the first active area 10 and the active area 12. In a preferred embodiment, the first side 32a is at a middle line m1 between the first active area 10 and the active area 14 while the third side 32c is at a middle line m2 between the first active area and the active area 12. By doing this, tolerance parts (meaning the two flap parts 324 of the bit line contact 32) can ensure the first active area 10 is not exposed while the shifting of the first active area 10 or the bit line contact 32 caused by photolithography and etching process occurs. Hence, this avoids turning on current between storage node contacts and the bit line contact 32 through the exposed part of first active area 10 and thus avoids short circuit occurring.

In this embodiment, the second direction C2 that the buried word lines 20 extend along is parallel to the fourth direction C4 that second side 32b and the fourth side 32d extend along, enabling the bit line contact 32 with a minimum layout area overlapping the whole first active area 10, and avoiding turning on current between storage node contacts and the bit line contact 32 through the exposed part of first active area 10 and thus avoiding short circuit occurring. Still preferably, the bit line contact 32 covers at least a part of the buried word lines 20 to ensure the first active area 10 not being exposed. Thereby, the second side 32b and the fourth side 32d of the bit line contact 32 are directly located on the two buried word lines 20 corresponding to two opposite sides of the first active area 10. Still preferably, the second side 32b and the fourth side 32d of the bit line contact 32 are directly located at middle lines m3/m4 of the two buried word lines 20 corresponding to the two opposite sides of the first active area 10, but it is not limited thereto.

A dynamic random access memory device 100 of the present invention may include a storage node contact 34 right next to the bit line contact 32. The bit line contact 32 may include the spacers 324a, thereby the storage node contact 34 can be self-aligned by the spacers 324a. The dynamic random access memory device 100 of the present invention may include a bit line gate 30, and the bit line gate 30 includes the bit line contact 32. The bit line gate 30 is disposed on the substrate 110 and extends along a fifth direction C5, wherein the second direction C2 that the buried word lines 20 extending along is orthogonal to the fifth direction C5.

Figure 2:
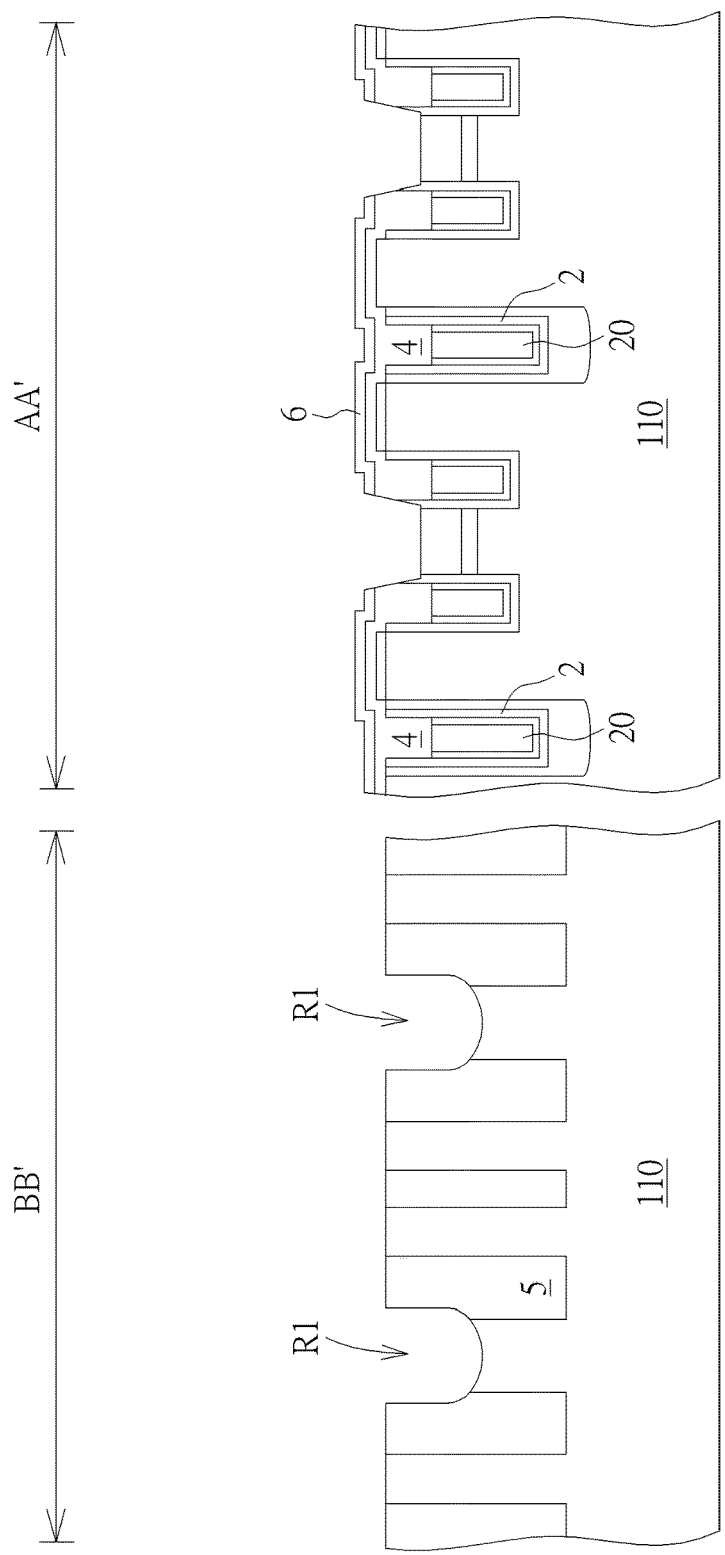
FIGS. 2-6 schematically depicts cross-sectional views of FIG. 1 along line A-A' and line B-B'.

Above all, FIG. 1 schematically depicts a top view of a dynamic random access memory device according to an embodiment of the present invention. FIGS. 2-6 schematically depicts cross-sectional views of FIG. 1 along line A-A' and line B-B'. Please refer to FIG. 1 and FIGS. 2-6. The figures of the present invention only depict a memory area of the substrate 110, but the substrate 110 may also include other logic areas. As shown in FIG. 2, a plurality of the buried word lines 20 are disposed in the substrate 110, recesses R1 are formed in the substrate 110 for forming bit line contacts in later processes, and isolation materials such as a plurality of oxide layers 2, nitride layers 4 and oxide layers 6 cover the substrate 110, but it is not limited thereto.

Figure 3:
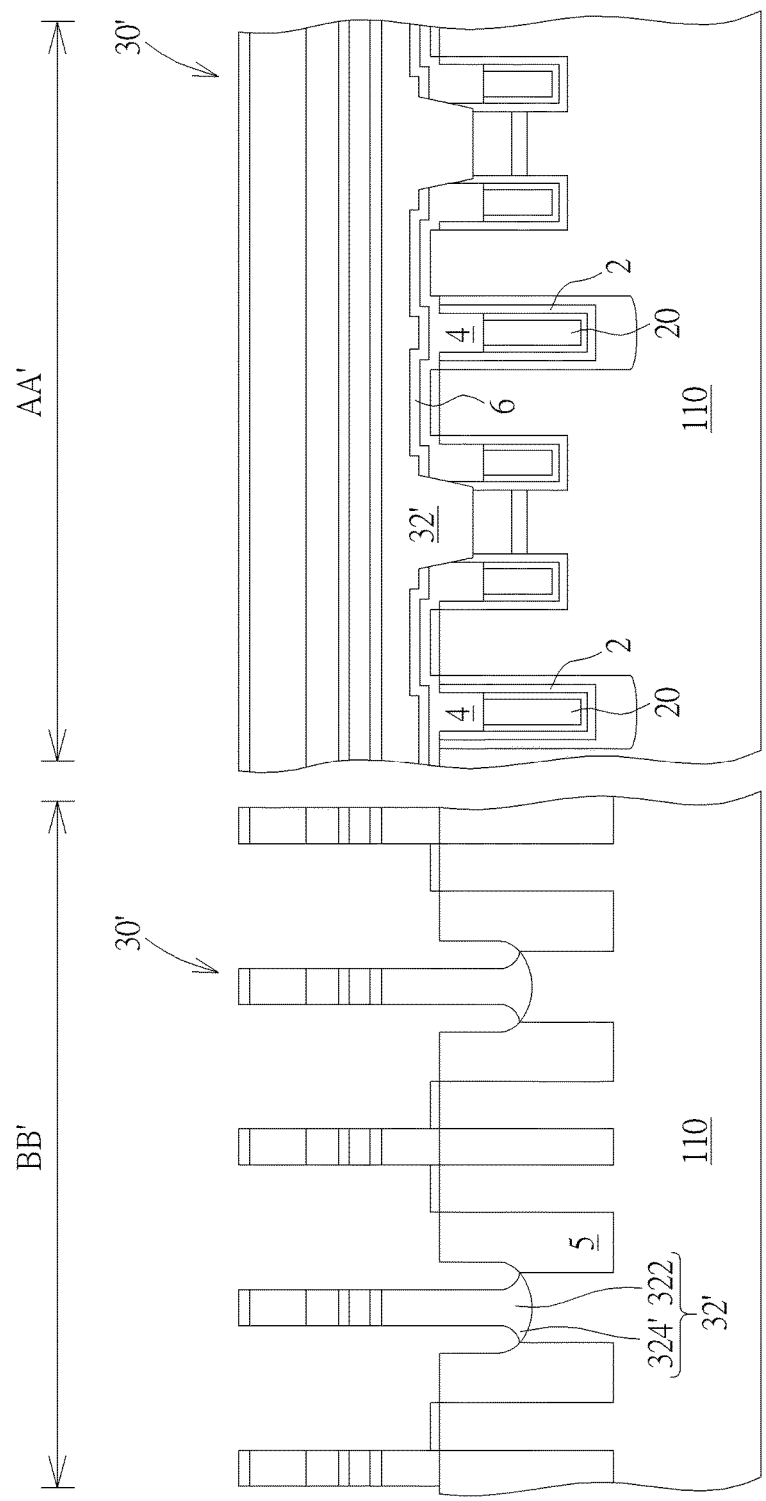

As shown in FIG. 3, bit line gates 30' are formed on the substrate 110, wherein each of the bit line gates 30' is preferably disposed on the substrate 110 and covers the plurality of buried word lines 20 in the substrate 110. Methods of forming each of the bit line gates 30' may include forming a plurality of material layers stacked on the substrate 110, wherein the material layers may include an amorphous silicon layer and a metal stacked structure stacked from bottom to top, but it is not limited thereto. The metal stacked structure may include a titanium layer, a titanium nitride layer, a first tungsten nitride layer and a tungsten layer or etc stacked from bottom to top; then, the material layers are patterned to form each of the bit line gates 30', thereby the bit line gate 30' having the bit line contact 32' at the bottom is formed, wherein the bit line contact 32' includes the body part 322 and a part of flap parts 324'.

Figure 4:
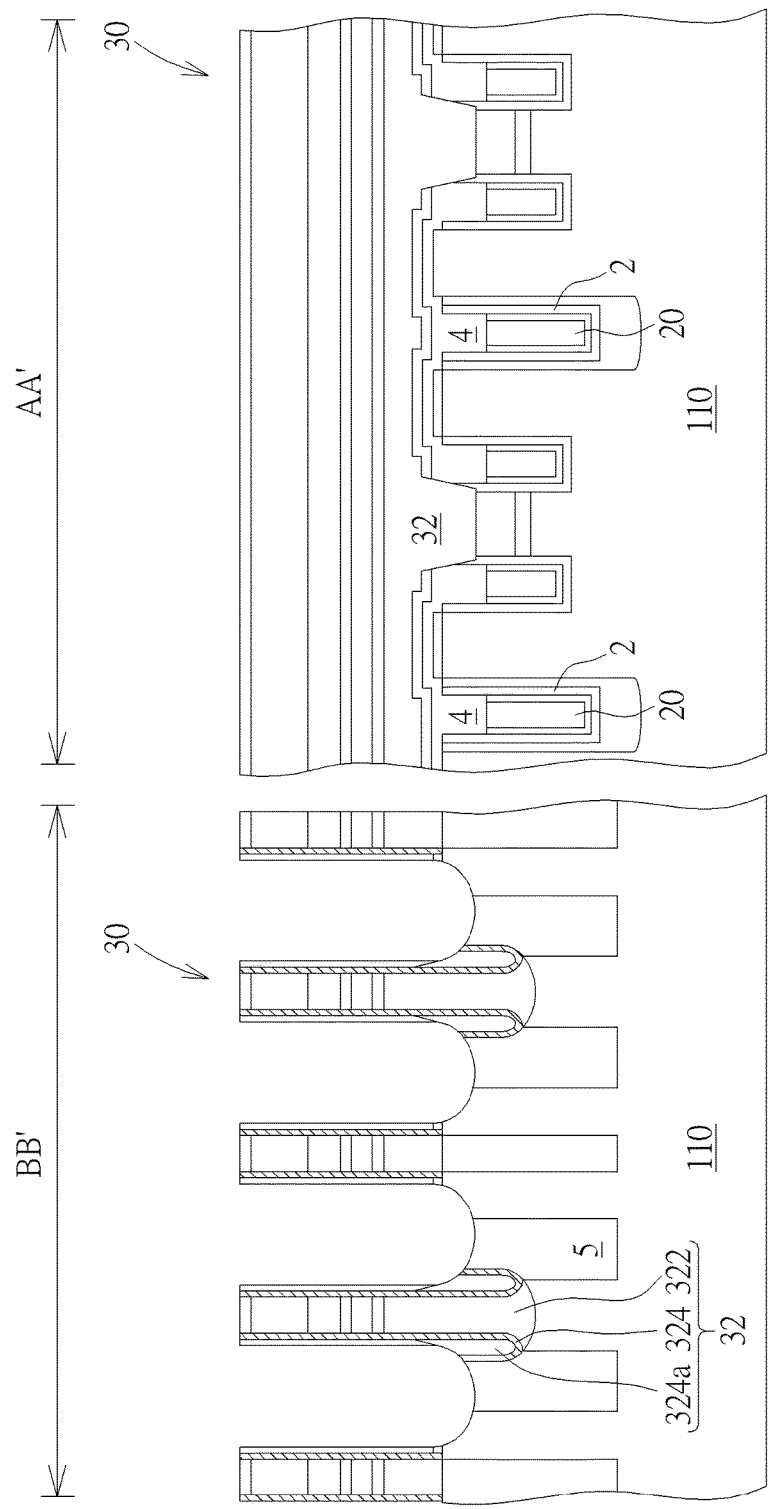

As shown in FIG. 4, the spacers 324a may be formed to cover two sides of each of the bit line gates 30', thereby the flap parts 324 of FIG. 1 being formed. The spacers 324a may be nitride layers, but it is not limited thereto. In this way, the bit line gates 30 having the bit line contacts 32 at the bottom are formed. That is, each of the bit line gates 30 and the corresponding bit line contact 32 are one piece, which may composed of one same polysilicon layer.

Figure 5:
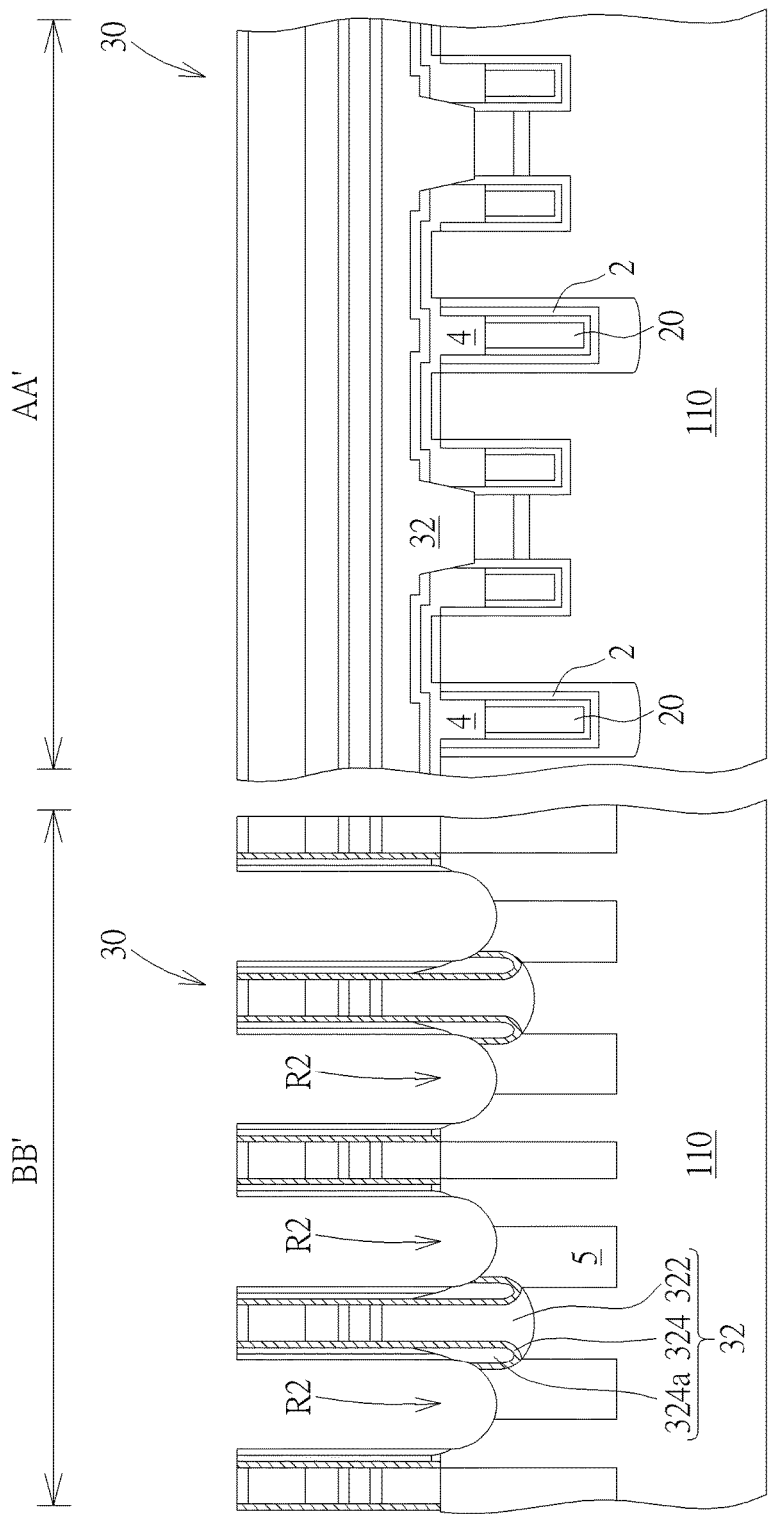

As shown in FIG. 5, recesses R2 are formed in the substrate 110 beside the bit line contacts 32 by methods such as etching for forming storage node contacts. Since the bit line contacts 32 have the spacers 324a, the recesses R2 can be formed by self-aligning the spacers 324a.

Figure 6:
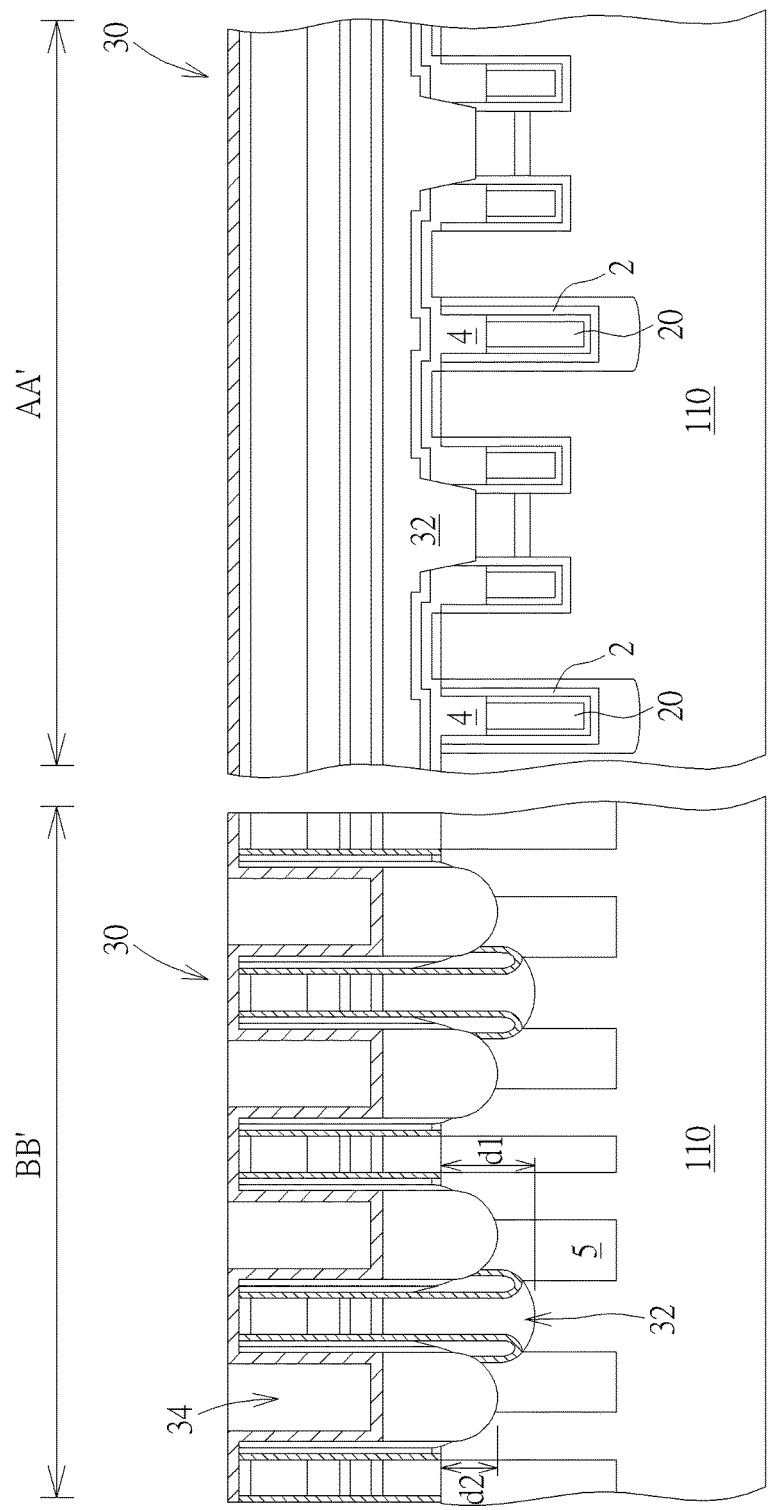

As shown in FIG. 6, the storage node contacts 34 are formed to cover the recesses R2. In one case, a depth d1 of each of the bit line contacts 32 is at a range of 350-450 nm while a depth d2 of each of the storage node contacts 34 is at a range of 250-350 nm.

To summarize, the present invention provides a dynamic random access memory (DRAM) including a first active area extending along a first direction, two buried word lines disposed across the first active area, and a bit line contact overlapping the first active area between the two buried word lines. It is emphasized that the bit line contact has a first side and a third side parallel to the first direction. Thereby, the bit line contact with a minimum layout area can completely overlap or extend from the first active area. Hence, this avoids turning on current between storage node contacts and the bit line contact and thus avoids short circuit occurring. Moreover, the bit line contact has a second side and a fourth side connecting to the first side and the third side, wherein the second side is parallel to the fourth side, and the second side and the fourth side are parallel to the buried word lines along a second direction. Thus, the bit line contact with a minimum layout area can overlap at least a part of the buried word lines for avoiding the first active area being exposed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dynamic random access memory (DRAM), comprising:
a substrate comprising a first active area, wherein the first active area extends along a first direction;
two buried word lines disposed in the substrate and across the first active area, wherein the buried word lines extend along a second direction; and
a bit line contact disposed on the substrate and overlapping the first active area between the two buried word lines, wherein the bit line contact is enclosed by a first side, a second side, a third side and a fourth side, and the first side is parallel to the third side along a third direction while the second side is parallel to the fourth side along a fourth direction, wherein the third direction is parallel to the first direction and the fourth direction is parallel to the second direction, and the first side and the third side do not overlap the first active area, thereby the bit line contact comprises a body part overlapping the first active area and two flap parts that do not overlapping the first active area.

2. The dynamic random access memory according to claim 1, wherein the substrate comprises two active areas beside the first active area and parallel to the first active area.

3. The dynamic random access memory according to claim 2, wherein the first side is between the first active area and one of the active areas while the third side is between the first active area and the other one of the active areas.

4. The dynamic random access memory according to claim 3, wherein the first side is at the middle line between the first active area and one of the active areas while the third side is at the middle line between the first active area and the other one of the active areas.

5. The dynamic random access memory according to claim 2, wherein the first active area and the two active areas are isolated from an isolation structure.

6. The dynamic random access memory according to claim 5, wherein the first side and the third side are directly on the isolation structure.

7. The dynamic random access memory according to claim 1, wherein the bit line contact overlaps the whole first active area between the two buried word lines.

8. The dynamic random access memory according to claim 1, wherein the second side is directly on one of the buried word lines while the fourth side is directly on the other one of the buried word lines.

9. The dynamic random access memory according to claim 8, wherein the second side is at the middle line of one of the buried word lines while the fourth side is at the middle line of the other one of the buried word lines.

10. The dynamic random access memory according to claim 1, wherein the angle between the first direction and the second direction is 70°-75°.

11. The dynamic random access memory according to claim 10, wherein the angle between the first direction and the second direction is 71.2°.

12. The dynamic random access memory according to claim 1, further comprising:
a bit line gate comprising the bit line contact, wherein the bit line gate is disposed on the substrate and extends along a fifth direction.

13. The dynamic random access memory according to claim 12, wherein the fifth direction is orthogonal to the second direction.

14. The dynamic random access memory according to claim 1, further comprising:
a storage node contact right next to the bit line contact.

15. The dynamic random access memory according to claim 14, wherein a depth of the bit line contact is at a range of 350-450 nm while a depth of the storage node contact is at a range of 250-350 nm.

* * * * *